(12) United States Patent
Chu et al.

(10) Patent No.: US 8,493,260 B2
(45) Date of Patent: Jul. 23, 2013

(54) SUCCESSIVE APPROXIMATION ANALOG TO DIGITAL CONVERTER

(75) Inventors: Yuan-Kai Chu, Tainan (TW); Jin-Fu Lin, Tainan (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 69 days.

(21) Appl. No.: 13/240,806

(22) Filed: Sep. 22, 2011

(65) Prior Publication Data

US 2013/0076554 A1   Mar. 28, 2013

(51) Int. Cl.
*H03M 1/14* (2006.01)
(52) U.S. Cl.
USPC .......................................... 341/172; 341/163
(58) Field of Classification Search
USPC .................. 341/161, 162, 163, 172
See application file for complete search history.

(56) References Cited

U.S. PATENT DOCUMENTS 7,274,321 B2 * 9/2007 Hurrell et al. .................. 341/172

OTHER PUBLICATIONS

J. Zhong et al., Multi-Merged-Switched Redundant Capcitive DACs for2b/cycle SAR ADC, 2011 IEEE 54th International Midwest Symposium on Circuits and Systems (MWSCAS), Aug. 7-10, 2011.*
Z. Cao et al., A 32 mW 1.25 GS/s 6b 2b/Step SAR ADC in 0.13 micrometer CMOS, IEEE Journal of Solid-State Circuits, Vol. 44, No. 3, Mar. 2009, pp. 862-873.*
Cao, Z., et al.; "A 32 mW 1.25 GS/s 6b 2b/Step SAR ADC in 0.13 μm CMOS;" IEEE Journal of Solid-State Circuits; vol. 44; No. 3; March 2009; pp. 862-873.

* cited by examiner

*Primary Examiner* — Howard Williams
(74) *Attorney, Agent, or Firm* — McClure, Qualey & Rodack, LLP

(57) ABSTRACT

A SAR ADC, used for converting an analog input into an N-bit digital output in a conversion phase, includes: three comparators, each two capacitor sub-arrays, coupled to the three comparators respectively, wherein the two capacitor sub-arrays are used for sampling the analog input and providing two inputs for the corresponding comparator; and an SAR logic, coupled to the three comparators and the three capacitor arrays, for, in each conversion sub-phase, coupling two selected capacitors of each capacitor sub-array to a set of determined reference levels, coupling two capacitors, which were selected in a preceding conversion sub-phase, of each capacitor sub-array to a set of adjusted reference levels obtained based on a set of data outputted from the three comparators in a preceding conversion sub-phase, and then generating two bits of the N-bit digital output by encoding a set of data outputted from the three comparators.

10 Claims, 8 Drawing Sheets

SUCCESSIVE APPROXIMATION ANALOG TO DIGITAL CONVERTER

CROSS REFERENCE TO RELATED APPLICATIONS

Background of the Invention

1. Field of the Invention

The present invention relates to a successive approximation (SAR) analog-to-digital converter (ADC), and in particular relates to a SAR ADC which converts 2 bits at a time.

2. Description of the Related Art

A successive approximation (SAR) analog-to-digital converter (ADC) is used to convert an analog input into a discrete digital representation through a binary search and converges upon a digital output for each conversion.

A 1-bit/step SAR ADC, commonly used in the prior art, can converts the analog input to the digital output only one bit at a time, and thus has been gradually replaced by the faster 2-bit/step SAR ADC which performs the analog-to digital conversion two bits at a time.

However, the faster 2-bit/step SAR ADC requires greater overall capacitances than the 1-bits/step SAR ADC and thus consumes more power. An SAR ADC which has a fast binary search and uses less capacitance units is desirable.

BRIEF SUMMARY OF THE INVENTION

The present invention provides a successive approximation register (SAR) analog-to-digital converter (ADC) for converting an analog input into an N-bit digital output in a conversion phase composed of a plurality of conversion sub-phases, includes: three comparators, each two capacitor sub-arrays, coupled to the three comparators respectively, wherein the two capacitor sub-arrays are used for sampling the analog input and providing two inputs for the corresponding comparator; and an SAR logic, coupled to the three comparators and the three capacitor arrays, for, in each conversion sub-phase, coupling two selected capacitors of each capacitor sub-array to a set of determined reference levels, coupling two capacitors, which were selected in a preceding conversion sub-phase, of each capacitor sub-array to a set of adjusted reference levels obtained based on a set of data outputted from the three comparators in a preceding conversion sub-phase, and then generating two bits of the N-bit digital output by encoding a set of data outputted from the three comparators.

The present invention also provides a successive approximation analog-to-digital converting method for converting an analog input into an N-bit digital output in a conversion phase composed of a plurality of conversion sub phases, comprising: providing three comparators; providing three capacitor arrays, each having two capacitor sub-arrays, coupled to the three comparators respectively, wherein the two capacitor sub-arrays are used for sampling the analog input and providing two inputs for the corresponding comparator; in each conversion sub-phase of the conversion phase, coupling two selected capacitors of each capacitor sub-array to a set of determined reference levels; coupling two capacitors, which were selected in a preceding conversion sub-phase, of each capacitor sub-array to a set of adjusted reference levels obtained based on a set of data outputted from the three comparators in a preceding conversion sub-phase; and then generating two bits of the N-bit digital output by encoding a set of data outputted from the three comparators.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 2A' shows the SAR ADC 100 and the logic level of the components thereof after the sampling phase before the conversion phase.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
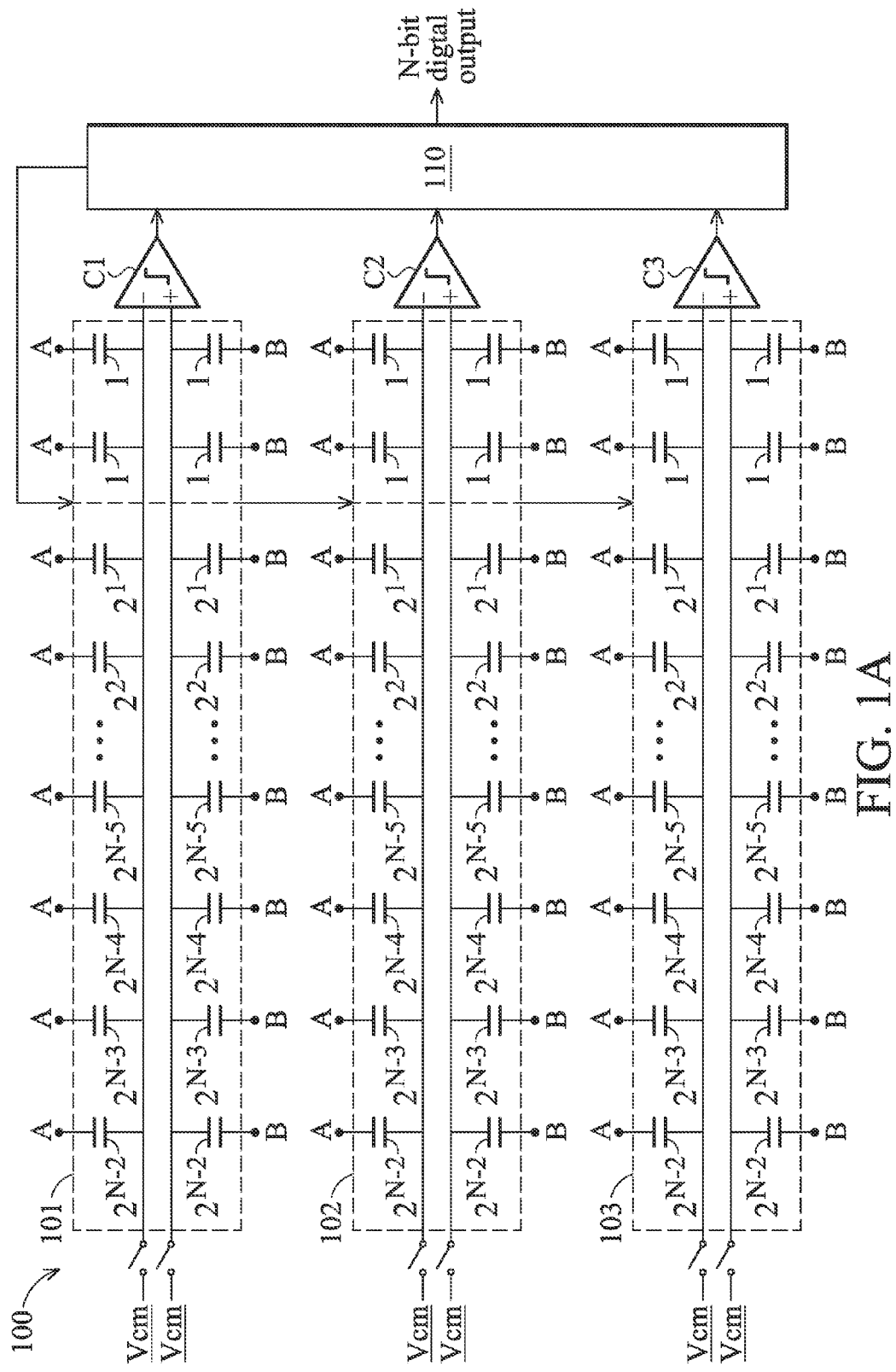
FIG. 1A is a schematic diagram of the successive approximation register (SAR) analog-to-digital converter (ADC) according to an embodiment of the present invention.
Figure 1B:
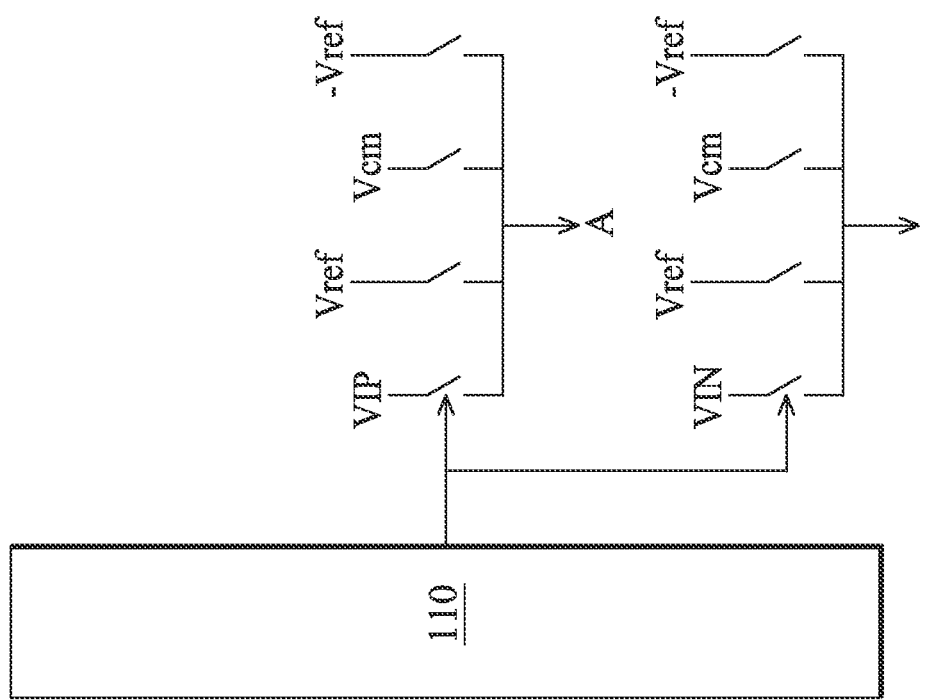
FIG. 1B shows the switches on the nodes A and nodes B of FIG. 1A.

FIG. 1A is a schematic diagram of the successive approximation register (SAR) analog-to-digital converter (ADC) according to an embodiment of the present invention. The SAR ADC 100 of the present invention, used for converting an analog input into an N-bit digital output, at least comprises three comparators C1, C2 and C3; three capacitor arrays 101, 102, and 103; and the SAR logic 110. FIG. 1B shows the switches on the nodes A and nodes B of FIG. 1A. The switches on the nodes A are controlled by the SAR logic 110 and switched among positive reference voltage Vref, negative reference voltage −Vref, common mode voltage Vcm and input voltage VIP; and the switches on the nodes B are controlled by the SAR logic 110 and switched among the positive reference voltage Vref, the negative reference voltage −Vref, the common mode voltage Vcm, and another input voltage VIN.

Each of the three comparators C1, C2 or C3 has a positive input "+" and a negative input "−". Each of the three capacitor arrays 101, 102, or 103 of the present invention, in this embodiment, is a binary-weighted capacitor array, which has a positive capacitor sub-array and a negative capacitor sub-array (not label in FIG. 1A), and, for N-bit digital output conversion, each of the positive and negative capacitor sub-arrays has N capacitors with capacitances of $2^{N-2}, 2^{N-3}, \ldots, 2^2, 2^1, 1$ and $1$. The positive and the negative capacitor sub-arrays are respectively coupled to the negative and the positive inputs of the respective one of the three comparators C1, C2 and C3. For example, as shown in FIG. 1, the negative and the positive capacitor sub-arrays of the capacitor array 101 are respectively coupled to the positive input "+" and the negative input "−" of the comparator C1. In a sampling phase, the three capacitor arrays 101, 102, or 103 are used for sampling two differential input voltage VIN and VIP of the analog input, and then the comparators C1, C2 and C3 respectively compare the voltage levels inputted to the positive input "+" and the negative input "−" to generate a set of data (i.e., comparison results) in each conversion sub-phase of a conversion phase.

The SAR ADC 100 of the present invention performs a conversion phase to convert the analog input into a digital output (for example, an N-bit digital output), where the conversion phase is composed of a plurality of conversion sub-phases. The SAR logic 110, coupled to the three comparators C1, C2 and C3, performs each conversion sub-phase and encodes the set of data outputted from the three comparators C1, C2 and C3 in each of the conversion sub-phases to obtain two bits of the N-bit digital output. Finally, the SAR ADC 100 converges all of the bits obtained from all of the conversion sub-phases as the N-bit digital output (i.e., parallel output). It should be noted that the SAR logic 110 of the present invention operates differently than that in the prior art. The SAR logic 110 and each of the conversion sub-phases will be further described in detail with an embodiment in accordance with FIGS. 2A-2D, and, in this embodiment, the analog input provided to the SAR ADC 100 is 15V (thus the differential positive input VIP is +7.5V and the differential negative input VIN is −7.5V), and the binary search is performed between the negative reference voltage (i.e., lower limit)-Vref=−32V and the positive reference voltage (i.e., upper limit) Vref=32V (thus the common mode voltage Vcm of the negative and positive reference voltage is 0). Hereafter, the positive reference voltage Vref, the negative reference voltage −Vref and the common mode voltage Vcm are represented as logic levels "−1", "1" and "0" respectively. The digital output is converted, for example, by an encoder disposed in the SAR logic 110 (not shown), into a digital code between 0 and 63, and the analog voltage equivalent of the digital code is defined according to the following table:

VIP (i.e., +7.5 volt in this embodiment) for sampling; and each negative capacitor sub-array is connected between the common mode voltage Vcm and the negative voltage input VIN (i.e., −7.5 volt in this embodiment) for sampling. After the sampling phase, each positive capacitor sub-array is further connected between the common mode voltage Vcm and the negative input of each comparator; and each negative capacitor sub-array is further connected between the common mode voltage Vcm and the positive input of each comparator (shown as FIG. 2A'). Since voltage levels coupled to the negative capacitor sub-arrays are always the opposite of those coupled to the positive capacitor sub-arrays in each conversion sub-phase, the negative capacitor sub-arrays are omitted from FIGS. 2B-2D for brevity.

After the sampling phase, the SAR logic 110, in each conversion sub-phase, further: (in step 1) couples two selected capacitors of each capacitor sub-array to a set of determined reference levels, where the two selected capacitors of each capacitor sub-array are the top two capacitors among the capacitors which have not been selected in a preceding conversion sub-phases; (in step 2) generates a set of adjusted reference levels based on a set of data outputted from the three comparators in a preceding conversion sub-phase; and couples the capacitors, which were selected in a preceding conversion sub-phases, of each capacitor sub-array to the set of adjusted reference levels; and (in step 3) generates two bits by encoding the set of data outputted from the three comparators C1, C2 and C3 after the step 1 and 2. In more detail for step 1, the two selected capacitors are selected from the maximum two capacitors in order for the conversion sub-phases respectively such that the maximum two capacitors are selected for the first conversion sub-phase and the minimum two capacitor are selected for the last conversion sub-phase. It is worth to note that the order of the step 1 and 2 can be arranged suitably. In another embodiment, the SAR logic may collect all sets of data outputted from the three comparators C1, C2 and C3 in all conversion sub-phases and then encodes all sets of data in the meantime, where a memory may be used in the SAR logic 110 for storing all sets of data.

TABLE 1

| | Digital Code | | | | | | | | | | | | | |
|---|---|---|---|---|---|---|---|---|---|---|---|---|---|---|
| | 0 | 1 | 2 | 3 | ... | 30 | 31 | 32 | 33 | 34 | ... | 38 | 39 | ... | 62 | 63 |
| Analog voltage equivalent (VIP-VIN) | −64~−62 | −62~−60 | −60~−58 | −58~−56 | | −4~−2 | −2~−0 | 0~−2 | 2~4 | 4~6 | | 12~14 | 14~16 | | 60~62 | 62~64 |

Figure 2A:
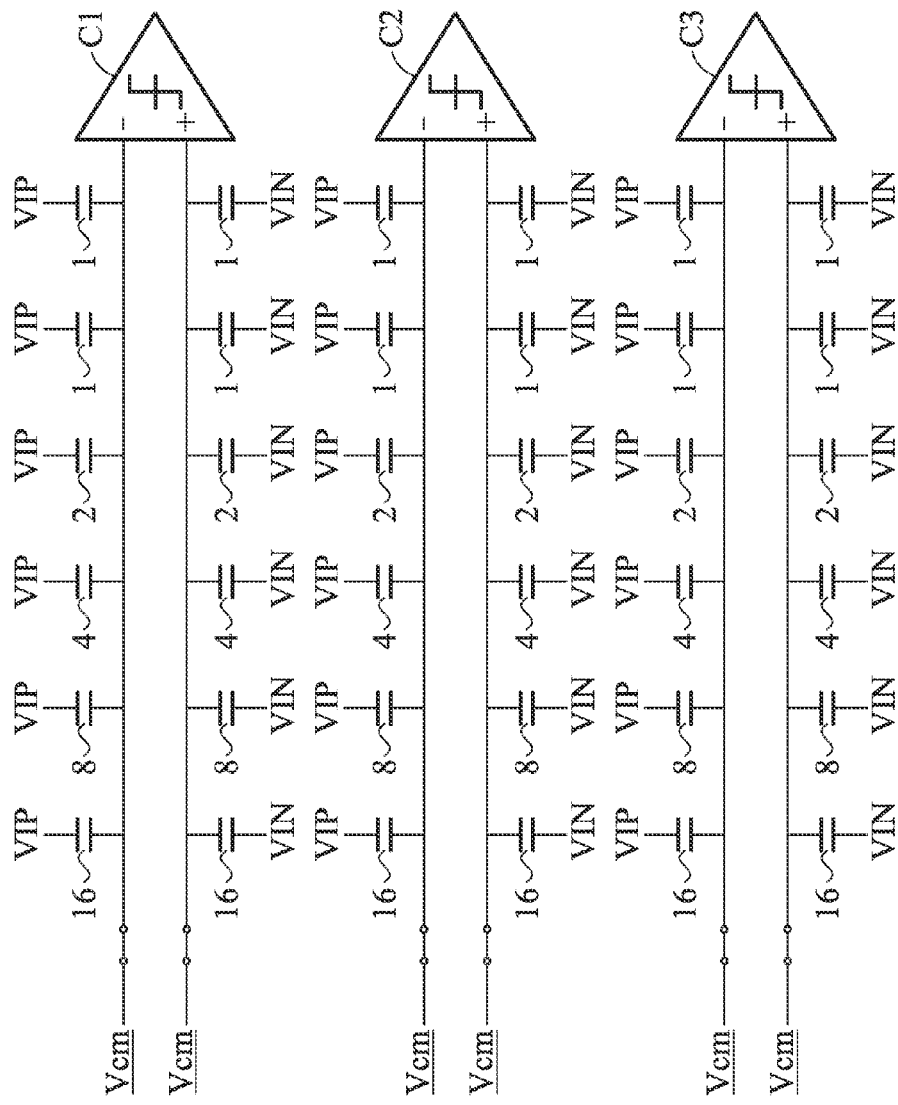
FIG. 2A shows the SAR ADC 100 and the logic level of the components thereof in a sampling phase before the conversion phase.
Figure 2A:
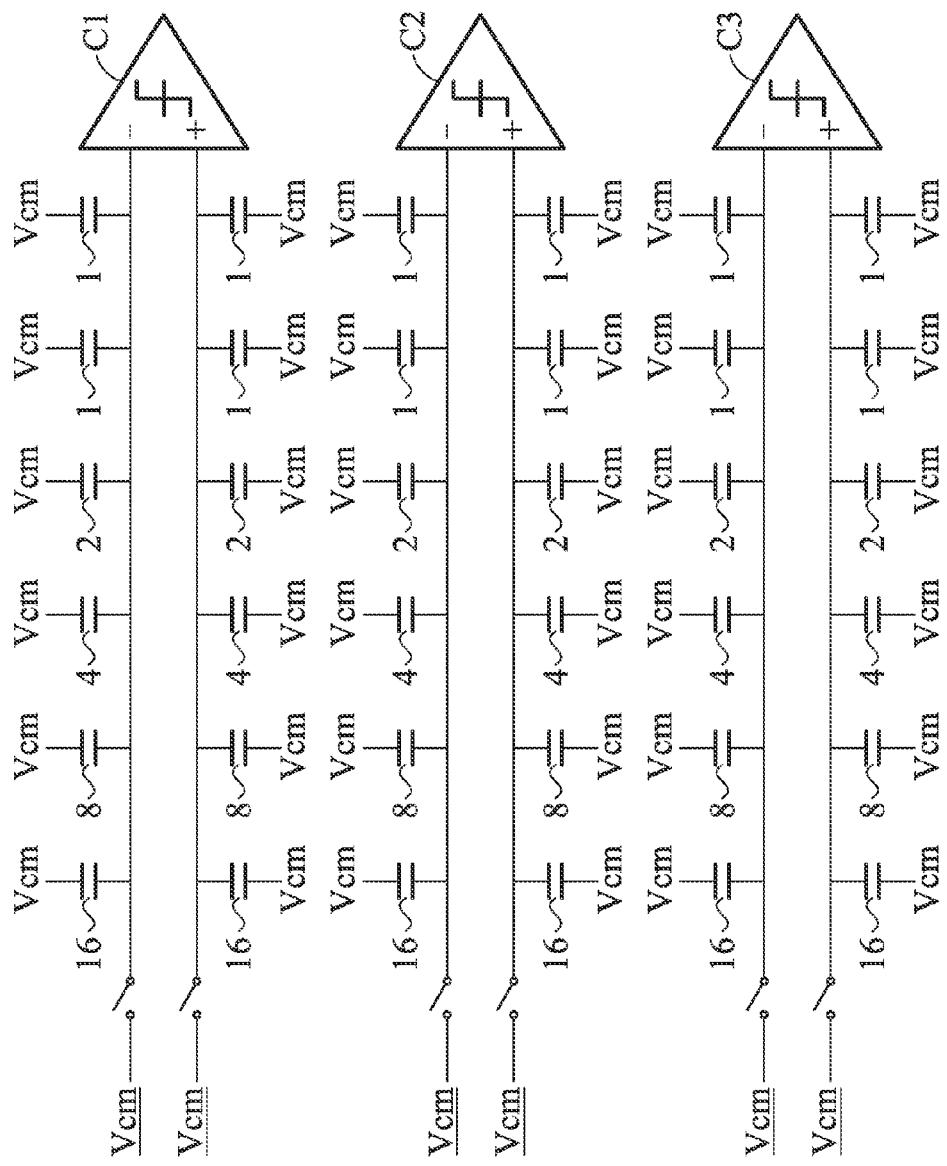

FIG. 2A shows the SAR ADC 100 and the logic level of the components thereof in a sampling phase before the conversion phase. In this embodiment, a 6-bit SAR ADC of the present invention is used, where the capacitor arrays of the 6-bit SAR ADC has a positive capacitor sub-array (in the upper side of each capacitor array) having 6 capacitors with capacitances of 16, 8, 4, 2, 1 and 1 unit(s), and a negative capacitor sub-arrays (in the lower side of each capacitor array) having 6 capacitors with capacitances of 16, 8, 4, 2, 1 and 1 (the capacitors are labeled by its capacitance in FIG. 2A). In the sampling phase in FIG. 2A, the SAR logic 110 controls the three capacitor arrays 101, 102 and 103 to sample the analog input (i.e., 15V in this embodiment). Specifically, each positive capacitor sub-array is connected between the common mode voltage Vcm and the positive voltage input The set of determined reference levels of the present invention, which is coupled to the two selected capacitors of the positive capacitor sub-arrays, is (Vref, Vcm), (Vcm, Vcm), (−Vref, Vcm) (i.e., (1, 0), (0, 0), (−1,0), for brevity); and, oppositely, the set of determined reference levels coupled to the two selected capacitors of the negative capacitor sub-arrays is (−1, 0), (0, 0), (1,0). The set of adjusted reference levels (i.e., (X+(n), X+(n−1)), which is coupled to the capacitors of the three positive capacitor sub-arrays, and the set of adjusted reference levels (X−(n), X−(n−1)), which is coupled to the capacitors of the three negative capacitor sub-arrays, are all generated by the SAR logic 110 based on the set of data outputted from the three comparators C1, C2 and C3 in a preceding conversion sub-phase according to the following table:

TABLE 2

| C1 | C2 | C3 | X + (n) | X + (n − 1) | X − (n) | X − (n − 1) |
|----|----|----|---------|-------------|---------|-------------|
| 0  | 0  | 0  | −1      | −1          | 1       | 1           |
| 0  | 0  | 1  | 0       | −1          | 0       | 1           |
| 0  | 1  | 1  | 0       | 1           | 0       | −1          |
| 1  | 1  | 1  | 1       | 1           | −1      | −1          |

Figure 2B:
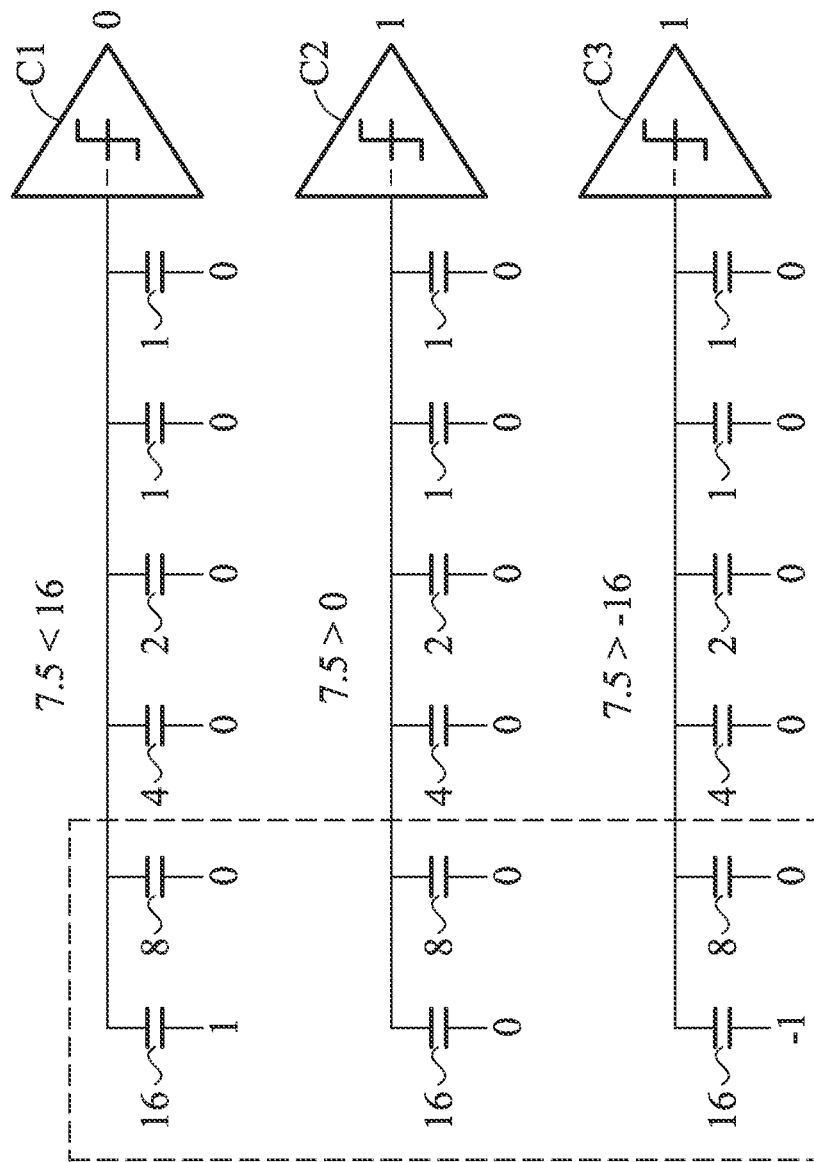
FIG. 2B shows the SAR ADC 100 and the logic level of the components thereof in a first conversion sub-phase.

FIG. 2B shows the SAR ADC 100 and the logic level of the components thereof in a first conversion sub-phase. Since there is no other conversion sub-phase before the first conversion sub-phase, the SAR logic 110 omits steps 2 and merely performs steps 1 and 3. Specifically, the SAR logic 110, in step 1, couples the two capacitors with capacitances of 16 and 8 units (i.e., top two) in the three positive capacitor sub-arrays to the determined reference levels (1, 0), (0, 0), (−1,0). Since, in this embodiment, the VIP 7.5 is smaller than 16, and greater than 0 and −16, the comparators C1, C2 and C3 collectively output a first set of data (0, 1, 1), as shown in FIG. 2B. The relationship between the output bits D(n) and D(n−1) and the set of data is shown in the following table:

TABLE 3

| C1 | C2 | C3 | D(n) | D2(n − 1) |
|----|----|----|------|-----------|
| 0  | 0  | 0  | 0    | 0         |
| 0  | 0  | 1  | 0    | 1         |
| 0  | 1  | 1  | 1    | 0         |
| 1  | 1  | 1  | 1    | 1         |

Therefore, in the step 3, the sixth and the fifth bits (D(6), D(5)) outputted by the SAR logic 110 in the first conversion sub-phase should be (1, 0), where the sixth bit D(6) is a most significant bit MSB.

Figure 2C:
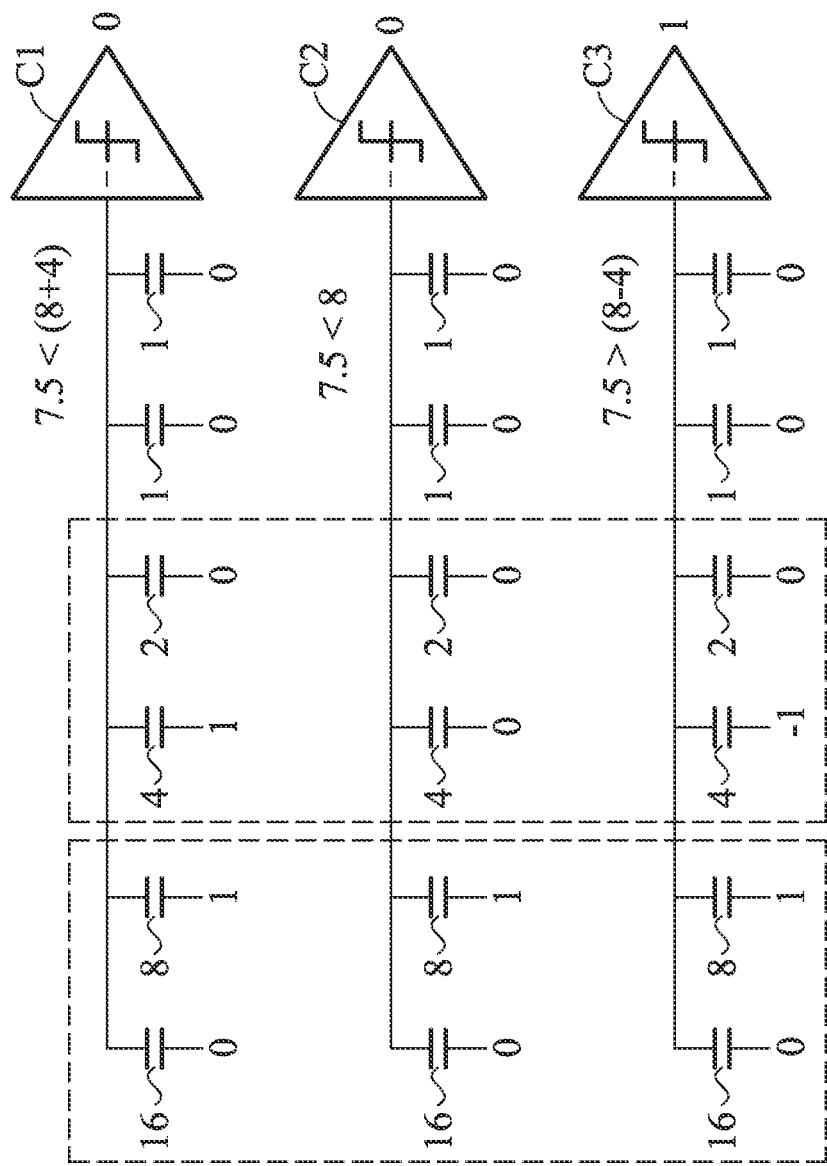
FIG. 2C shows the SAR ADC 100 and the logic level of the components thereof in a second conversion sub-phase.

FIG. 2C shows the SAR ADC 100 and the logic level of the components thereof in a second conversion sub-phase. In the second sub-phase, the SAR logic 110 performs all the steps 1-3. Specifically, the SAR logic 110, in step 1, couples the two capacitors with capacitances of 4 and 2 units of the three positive capacitor sub-arrays (which are the top two capacitors of each capacitor sub-array among the capacitors which have not been selected in the first conversion sub-phase) to the determined reference levels (1, 0), (0, 0), and (−1,0). The SAR logic 110, in step 2, generates a first set of the adjusted reference levels, which is (0,1), (0,1), (0,1), based on the first set of data (0, 1, 1) outputted from the three comparators C1, C2, and C3 in the first conversion sub-phase (please refer to Table 2), and couples the two capacitors with capacitances of 16 and 8 units (which were selected in the first conversion sub-phase preceding this conversion sub-phase) to the first set of the adjusted reference levels (0,1), (0,1), (0,1). Since the VIP 7.5 is smaller than 12 (8 plus 4) and 8, and greater than 4 (8 minus 4), the comparators C1, C2 and C3 collectively output a second set of data (0, 0, 1), as shown in FIG. 2C. According to Table 3, in step 3, the fourth and the third bits (D(4), D(3)) outputted by the SAR logic 110 in the second conversion sub-phase should be (0, 1)

Figure 2D:
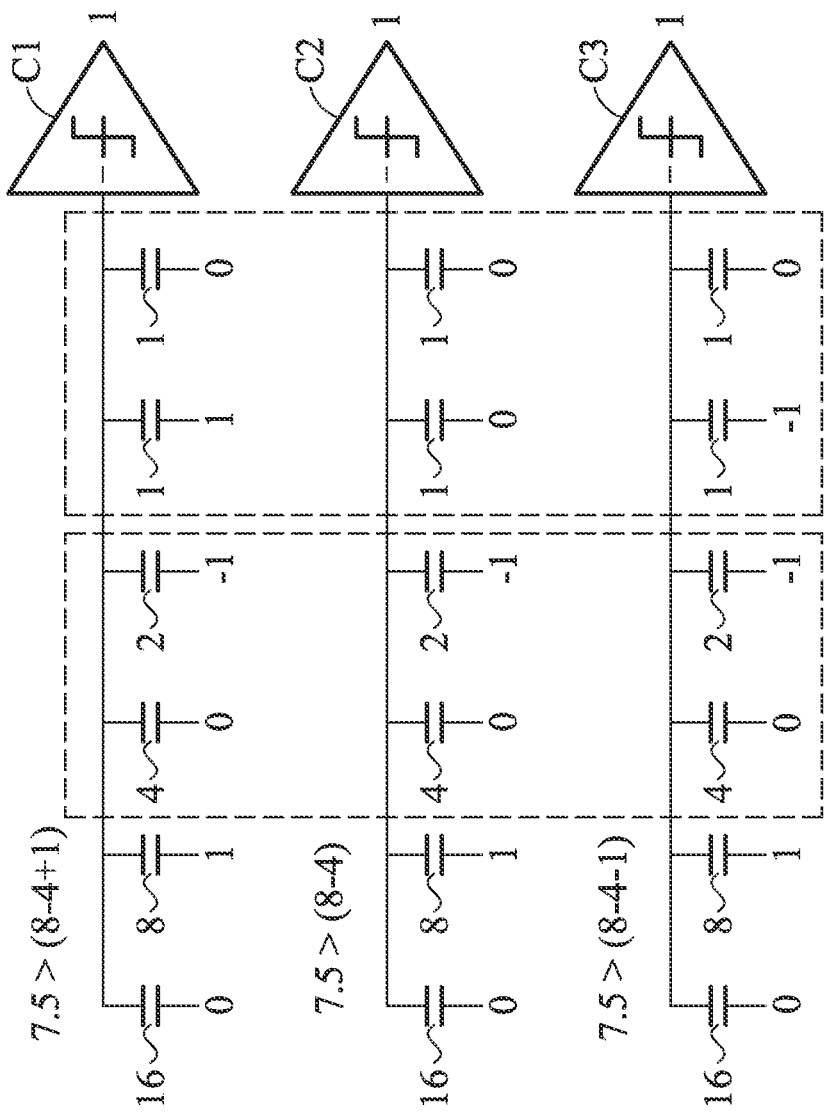
FIG. 2D shows the SAR ADC 100 and the logic level of the components thereof in a third conversion sub-phase.

FIG. 2D shows the SAR ADC 100 and the logic level of the components thereof in a third conversion sub-phase. Specifically, the SAR logic 110, in step 1, couples the two capacitors with capacitance of 1 unit in the three positive capacitor sub-arrays (which are the top two capacitors of each capacitor sub-array among the capacitors which have not been selected in the first and the second conversion sub-phases) to the determined reference levels (1, 0), (0, 0), and (−1,0). The SAR logic 110, in step 2, generates a second set of the adjusted reference levels, which is (0,−1), (0,−1), (0,−1), based on the second set of data (0, 0, 1) outputted from the three comparators C1, C2, and C3 respectively in the second conversion sub-phase (please refer to Table 2); and couples the two capacitors with capacitances of 4 and 2 units (which were selected in the second conversion sub-phase preceding this conversion sub-phase) to the second set of the adjusted reference levels (0,−1), (0,−1), (0,−1). Since the VIP 7.5 is greater than 5 (8 minus 4 plus 1), 4 (8 minus 4) and 3 (8 minus 4 minus 1), the comparators C1, C2 and C3 collectively outputs a third set of data (1, 1, 1), as shown in FIG. 2D. According to Table 3, in step 3, the second and the first two bits (D(2), D(1)) outputted by the SAR logic 110 in the third conversion sub-phase should be (1, 1), where the first bit D(1) is a least significant bit LSB. Thus, after the third conversion phase, the final 6-bit digital output (100111), which is the combination of the bits outputted in all of the conversion sub-phase, can be found. The digital code of the 6-bit digital output (100111) is 39, and, according to Table 1, it can be found that the analog input falls in the range from 14V to 16V.

With the particular SAR logic 110 of the present invention as described above, the SAR ADC 100 can perform the successive approximation twice as fast as the 1 bit/step SAR ADC in the prior art. Moreover, the capacitors of the SAR ADC 100 of the present invention have lower overall capacitances than those of any other 2 bit/step SAR ADC in the prior art, which means that the SAR ADC 100 of the present invention not only operates faster but also reduces power consumption.

Figure 3:
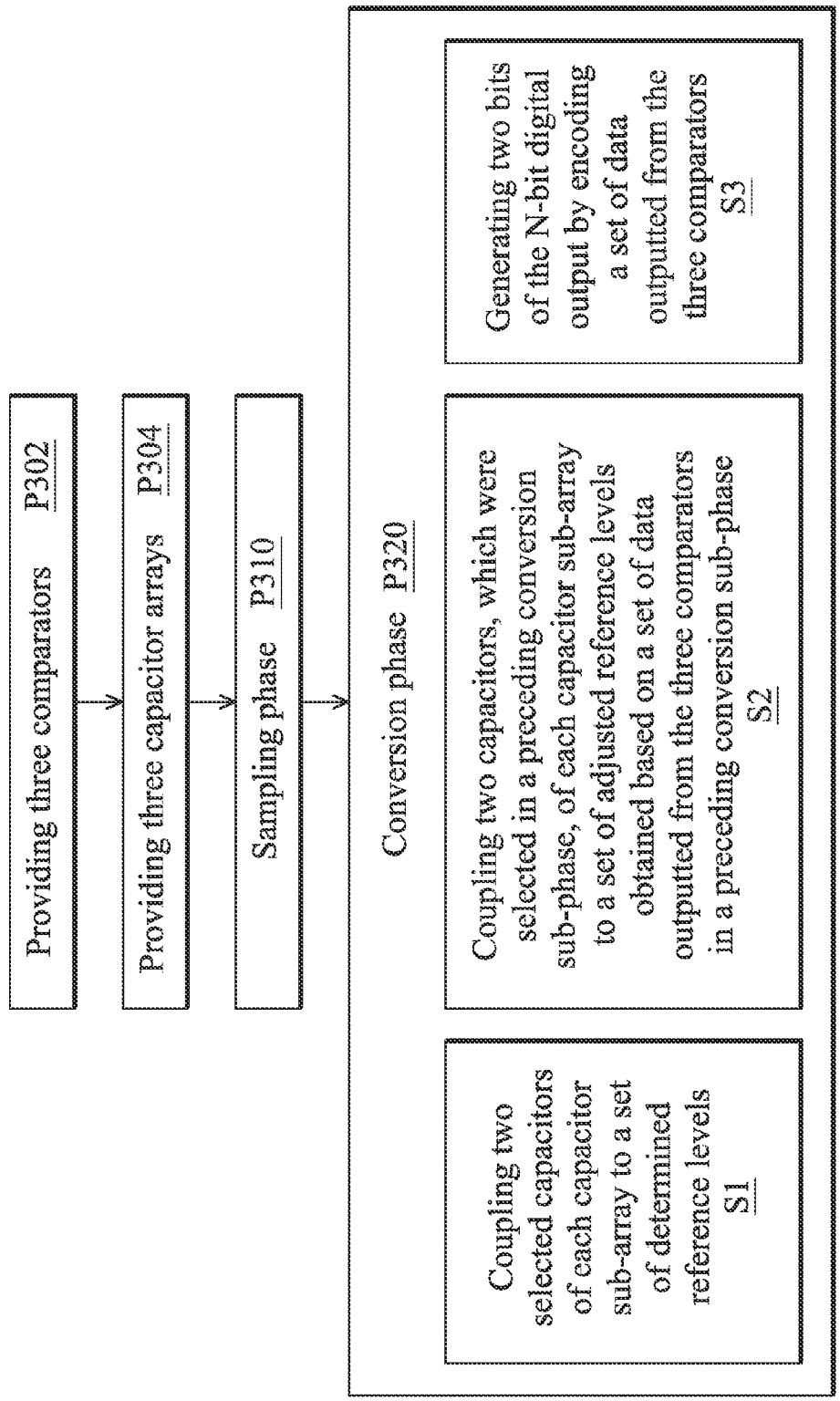
FIG. 3 shows the flowchart of the successive approximation analog-to digital converting method according to an embodiment of the present invention.

In addition to the SAR ADC 100, the present invention further provides a successive approximation analog-to digital converting method for converting an analog input into an N-bit digital output in a conversion phase. FIG. 3 shows the flowchart of the successive approximation analog-to digital converting method according to an embodiment of the present invention. The method of the present invention will be described with an embodiment in accordance with FIG. 3 and FIG. 1A. In step P302, three comparators (C1, C2, and C3), each having a positive and a negative input ("+" and "−"), is provided; and, in step P304, three capacitor arrays (101, 102, and 103), each having a positive and a negative capacitor sub-array, is provided. The positive and the negative capacitor sub-arrays are respectively coupled to the negative and the positive inputs of the respective one of the three comparators (C1, C2, and C3), for a sampling phase and a conversion phase. Note that each of the capacitor arrays of the present invention is a binary-weighted capacitor array, and, for the conversion of a N-bit digital output, each of the positive capacitor sub-arrays has N capacitors with capacitances of $2^{N-2}, 2^{N-3}, \ldots, 2^2, 2^1, 1$ and 1 unit(s), and each of the negative capacitor sub-arrays has N capacitors with capacitances of $2^{N-2}, 2^{N-3}, \ldots, 2^2, 2^1, 1$ and 1. The present invention performs the sampling phase (P310) before the conversion phase, which controls the three capacitor arrays to sample the analog input (VIP and VIN). Then, the present invention performs a conversion phase P320. The conversion phase P320 comprises several conversion sub-phases, and, in each sub-phase, steps S1, S2, and S3 may be executed. In step S1, two selected capacitors of each capacitor sub-array are coupled to a set of determined reference levels. In step S2, a set of adjusted reference levels is generated based on a set of data outputted from the three comparators in a preceding conversion sub-phase, and the capacitors of each capacitor sub-array which was selected in a preceding conversion sub-phase is coupled to the set of adjusted reference levels. In step S3, the set of data outputted from the three comparators in each conversion sub-phase is encoded to obtain two bits of the N-bit digital output. By repeating the conversion sub-phase S1~S3 after the sampling phase, the final N-bit digital output can be successively approached. The sampling phase P310 and the conversion phase P320 of the present invention are similar to the operation of the SAR ADC 100, and since the preferred embodiment of the SAR ADC 100 has been fully described above, embodiments of the present method will not be further discussed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A successive approximation register (SAR) analog-to-digital converter (ADC) for converting an analog input into an N-bit digital output in a conversion phase composed of a plurality of conversion sub-phases, comprising:
   three comparators;
   three capacitor arrays, each having two capacitor sub-arrays, coupled to the three comparators respectively, wherein the two capacitor sub-arrays are used for sampling the analog input and providing two inputs for the corresponding comparator;
   an SAR logic, coupled to the three comparators and the three capacitor arrays, for, in each conversion sub-phase, coupling two selected capacitors of each capacitor sub-array to a set of determined reference levels, coupling two capacitors, which were selected in a preceding conversion sub-phase, of each capacitor sub-array to a set of adjusted reference levels obtained based on a set of data outputted from the three comparators in a preceding conversion sub-phase, and then generating two bits of the N-bit digital output by encoding a set of data outputted from the three comparators,
   wherein the SAR logic is further used for controlling the three capacitor arrays to sample the analog input before the conversion phase, wherein the analog input includes a differential positive input and a differential negative input, the SAR logic controls the two capacitor sub-arrays of each capacitor array to sample the differential positive input and the differential negative input respectively,
   wherein, in each conversion sub-phase, the set of adjusted reference levels coupled to the two capacitors of the three capacitor sub-arrays for sampling the differential positive input is:
   (−1,−1), (−1,−1), and (−1,−1) if the set of data outputted from the three comparators in a preceding conversion sub-phase is (0,0,0);
   (0,−1), (0,−1), and (0,−1) if the set of data outputted from the three comparators in a preceding conversion sub-phase is (0,0,1)/(1,0,0);
   (0,1), (0,1), and (0,1) if the set of data outputted from the three comparators in a preceding conversion sub-phase is (0,1,1)/(1,1,0); and
   (1,1), (1,1), and (1,1) if the set of data outputted from the three comparators in a preceding conversion sub-phase is (1,1,1),
   wherein, the "1" represents positive reference level, the "−1" represents negative reference level, and the "0" represents a common mode voltage related to the positive and negative reference level.

2. The SAR ADC as claimed in claim 1, wherein the set of the determined or the adjusted reference levels coupled to the capacitor sub-arrays for sampling the differential positive input, and those coupled to the capacitor sub-arrays for sampling the differential negative input are the opposite of each other.

3. The SAR ADC as claimed in claim 2, wherein, in each conversion sub-phase, the set of determined reference levels coupled to the two selected capacitors of the three capacitor sub-arrays for sampling the differential positive input is (1, 0), (0, 0), and (−1,0), wherein, the "1" represents positive reference level, the "−1" represents negative reference level, and the "0" represents a common mode voltage related to the positive and negative reference level.

4. The SAR ADC as claimed in claim 1, wherein each of the capacitor sub-arrays is a binary-weighted capacitor array, and each of the capacitor sub-arrays has N capacitors with capacitances of $2^{N-2}, 2^{N-3}, \ldots 2^2, 2^1, 1$ and 1 unit(s).

5. The SAR ADC as claimed in claim 4, wherein, for each capacitor sub-array, the two selected capacitors are the top two capacitors among the capacitors which have not been selected in a preceding conversion sub-phases.

6. A successive approximation analog-to-digital converting method for converting an analog input into an N-bit digital output in a conversion phase composed of a plurality of conversion sub phases, comprising:
   providing three comparators;
   providing three capacitor arrays, each having two capacitor sub-arrays, coupled to the three comparators respectively, wherein the two capacitor sub-arrays are used for sampling the analog input and providing two inputs for the corresponding comparator;
   in each conversion sub-phase of the conversion phase,
   coupling two selected capacitors of each capacitor sub-array to a set of determined reference levels;
   coupling two capacitors, which were selected in a preceding conversion sub-phase, of each capacitor sub-array to a set of adjusted reference levels obtained based on a set of data outputted from the three comparators in a preceding conversion sub-phase; and then
   generating two bits of the N-bit digital output by encoding a set of data outputted from the three comparators,
   controlling the three capacitor arrays to sample the analog input before the conversion phase, wherein the analog input includes a differential positive input and a differential negative input, and the two capacitor sub-arrays of each capacitor array to sample the differential positive input and the differential negative input respectively,
   wherein, in each conversion sub-phase, the set of adjusted reference levels coupled to the two capacitors of the three positive capacitor sub-arrays for sampling the differential positive input is:
   (−1,−1), (−1,−1), and (−1,−1) if the set of data outputted from the three comparators in a preceding conversion sub-phase is (0,0,0);
   (0,−1), (0,−1), and (0,−1) if the set of data outputted from the three comparators in a preceding conversion sub-phase is (0,0,1)/(1,0,0);
   (0,1), (0,1), and (0,1) if the set of data outputted from the three comparators in a preceding conversion sub-phase is (0,1,1)(1,1,0); and
   (1,1), (1,1), and (1,1) if the set of data outputted from the three comparators in a preceding conversion sub-phase is (1,1,1),
   wherein, the "1" represents positive reference level, the "−1" represents negative reference level, and the "0"

represents a common mode voltage related to the positive and negative reference level.

7. The successive approximation analog-to-digital converting method as claimed in claim 6, wherein the set of the determined or the adjusted reference levels coupled to the capacitor sub-arrays for sampling the differential positive input, and those coupled to the capacitor sub-arrays for sampling the differential negative input are the opposite of each other.

8. The successive approximation analog-to-digital converting method as claimed in claim 6, wherein, in each conversion sub-phase, the set of determined reference levels coupled to the two selected capacitors of the three positive capacitor sub-arrays for sampling the differential positive input is (1, 0), (0, 0), and (−1,0), wherein, the "1" represents positive reference level, the "−1" represents negative reference level, and the "0" represents a common mode voltage related to the positive and negative reference level.

9. The successive approximation analog-to-digital converting method as claimed in claim 6, wherein each of the capacitor arrays is a binary-weighted capacitor array, and each of the positive capacitor sub-arrays has N capacitors with capacitances of $2^{N-2}, 2^{N-3}, \ldots, 2^2, 2^1, 1$ and 1 unit(s).

10. The successive approximation analog-to-digital converting method as claimed in claim 9, wherein the two selected capacitors of each capacitor sub-array are the top two capacitors of each capacitor sub-array among the capacitors which have not been selected in a preceding conversion sub-phases.

* * * * *